US012796215B2

(12) United States Patent
Hu et al.

(10) Patent No.: US 12,796,215 B2
(45) Date of Patent: Nov. 10, 2026

(54) DISPLAY PANEL AND DISPLAY APPARATUS

(71) Applicant: Hubei Yangtze Industrial Innovation Center Of Advanced Display Co., Ltd., Wuhan (CN)

(72) Inventors: Liang Hu, Wuhan (CN); Yu Cai, Wuhan (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 697 days.

(21) Appl. No.: 17/718,360

(22) Filed: Apr. 12, 2022

(65) Prior Publication Data

US 2023/0217715 A1 Jul. 6, 2023

(30) Foreign Application Priority Data

Dec. 31, 2021 (CN) ......................... 202111678514.9

(51) Int. Cl.
*H10K 50/858* (2023.01)
*H10K 59/122* (2023.01)

(52) U.S. Cl.
CPC ......... *H10K 50/858* (2023.02); *H10K 59/122* (2023.02)

(58) Field of Classification Search
CPC .... H10K 59/122; H10K 59/00; H10K 50/865; H10K 50/858; H10K 50/856
See application file for complete search history.

(56) References Cited

U.S. PATENT DOCUMENTS

2015/0123150 A1 5/2015 Adachi
2019/0165061 A1* 5/2019 Jung ..................... G06F 3/0412
(Continued)

FOREIGN PATENT DOCUMENTS

CN 110232298 A 9/2019
CN 113 13 06 16 A 7/2021
CN 113161504 A 7/2021
(Continued)

OTHER PUBLICATIONS

The First Office Action for Chinese Application No. 202111678514.9, dated Aug. 30, 2023, 9 pages.

*Primary Examiner* — Vongsavanh Sengdara
(74) *Attorney, Agent, or Firm* — East IP P.C.

(57) ABSTRACT

The present application provides a display panel and a display apparatus. The display panel includes: a substrate and a pixel definition layer located on one side of the substrate where the pixel definition layer includes a plurality of pixel openings arranged in an array, and a projection of the pixel opening on the substrate includes a first side edge. The display panel further includes a first dimming layer located on a side of the pixel definition layer away from the substrate, the first dimming layer including a plurality of dimming openings each corresponding to one of the pixel openings. The projection of the dimmer opening on the substrate includes a body portion and at least one first protrusion, and in the plane of the projection, the first protrusion is at least partially located on a side of the first side edge away from a center of the dimmer opening.

16 Claims, 7 Drawing Sheets

(56) References Cited

U.S. PATENT DOCUMENTS

| | | | |
|---|---|---|---|
| 2020/0303472 A1 | 9/2020 | Lou et al. | |
| 2022/0173361 A1* | 6/2022 | Cho | G06F 3/0412 |

FOREIGN PATENT DOCUMENTS

| | | | |
|---|---|---|---|
| CN | 11332 8055 | A | 8/2021 |
| CN | 11383 5262 | A | 12/2021 |
| CN | 114 33 5388 | A | 4/2022 |
| KR | 201 7000 1897 | A | 1/2017 |

* cited by examiner

DISPLAY PANEL AND DISPLAY APPARATUS

CROSS-REFERENCE TO RELATED APPLICATION

This application claims priority to Chinese Patent Application No. 202111678514.9, filed on Dec. 31, 2021, which is hereby incorporated by reference in its entirety.

TECHNICAL FIELD

The present application relates to the field of display technology, and in particular to a display panel and a display apparatus.

BACKGROUND

An organic light-emitting display (OLED) is used in an organic light-emitting display apparatus as a light-emitting element, which has the property of self-luminescence and does not need to be additionally provided with a light source, so that it facilitates the overall slimness of the display apparatus and enables the fabrication of a flexible display screen. In addition, organic self-luminescence display technology has the properties of fast response and wide viewing angle, so that it has become the focus of current research.

In current display panels, as the integration degree of the panels becomes higher and higher, the number of film layers over the light-emitting material layer gradually increases, and the increase of the number of the film layers leads to an increase in light loss between the film layers and a decrease in light emitting efficiency. Therefore, there is an urgent need for an organic light-emitting display device that can improve light emitting efficiency.

SUMMARY

Embodiments of the present application provide a display panel and a display apparatus to solve the problem of low light emitting efficiency of the display panels in the prior art and to improve the quality of the display panels.

The embodiments of the present application provide a display panel including:

- a substrate;
- a pixel definition layer located on a side of the substrate and comprising a plurality of pixel openings arranged in an array, a projection of each of the pixel openings on the substrate comprising a first side edge;
- a plurality of light-emitting units each corresponding to one of the pixel openings, and each located in the corresponding one of the pixel openings;
- a first dimming layer located on a side of the pixel definition layer away from the substrate, the first dimming layer comprising a plurality of dimming openings each corresponding to one of the pixel openings;
- a second dimming layer located on a surface of a side of the first dimming layer away from the substrate, a refractive index of the second dimming layer being greater than a refractive index of the first dimming layer;
- a projection of each of the dimmer openings on the substrate comprising a body portion and at least one first protrusion connected to the body portion, and in a plane of the projection, the first protrusion being at least partially located on a side of a first side edge of a pixel opening corresponding to the dimmer opening that is away from a center of the dimmer opening.

In some embodiments, the display panel further includes a color film layer on a side of the light-emitting element away from the substrate; the color film layer includes a plurality of filtering units and a shading portion, where the shading part defines a plurality of first openings, and a projection of the filtering unit on the plane where the shading part is located covers the first opening; in a light-emitting direction of the display panel, the first opening overlaps the light-emitting element, and the projection of the metal portion on the color film layer covers the first opening.

The application also provides a display apparatus including a display panel according to any of the embodiments of the application.

The display panel and the display apparatus according to the present application have the following advantageous effects:

The dimming opening in the display panel has a body portion and at least one first protrusion connected to the body portion. Therefore, during the fabrication of the display panel, the alignment deviation between the mask plate and the substrate will be partially offset by the first protrusion. Finally, after the alignment deviation occurs, the dimming opening of the first dimming layer can reduce the effect of process fluctuation on the light efficiency, thereby solving the problem of the optical difference in viewing angles in different directions occurring in the display panel, improving the light extraction effect the display panel, and ensuring good display effect of the display panel.

BRIEF DESCRIPTION OF THE DRAWINGS

In order to explain the embodiments of the present application or the technical solutions in the prior art more clearly, a brief introduction will be given below to the accompanying drawings which are used in the description of the embodiments or the prior art. It is obvious that the drawings in the description below are some embodiments of the present application, and it would have been obvious for a person skilled in the art to obtain other drawings according to these drawings without involving any inventive effort.

DETAILED DESCRIPTION

The embodiments of the present application will now be described more fully hereinafter with reference to the accompanying drawings, in which some, but not all embodiments of the application are shown. Based on the embodiments of the present application, all other embodiments obtained by a person skilled in the art without inventive effort fall within the scope of protection of the present application.

The terminology used in the examples of the application herein is for the purpose of describing particular embodiments only and is not intended to be limiting of the application. As used in the embodiments of the application and the appended claims, the singular forms “a”, “an”, and “the” are intended to include the plural forms as well, unless the context clearly indicates otherwise.

Figure 1:
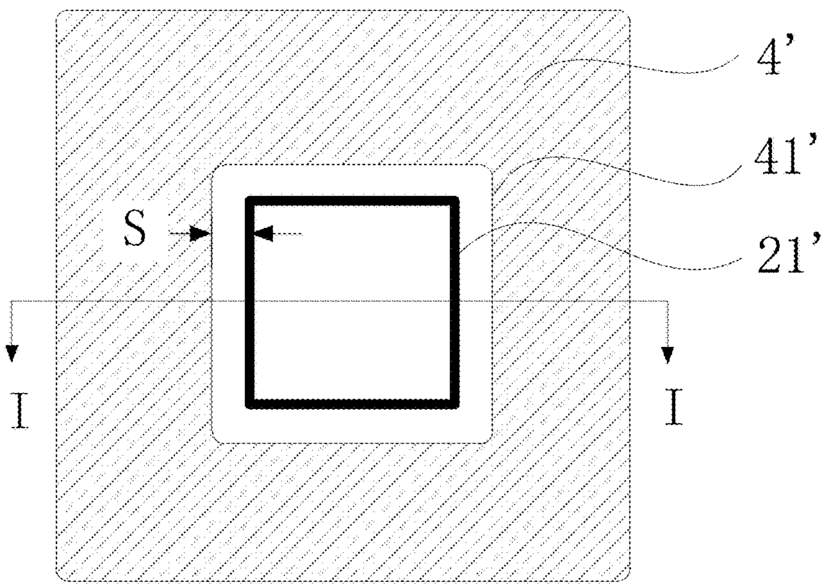
FIG. 1 is a partial top view of display panel 000 in a related art.
Figure 2:
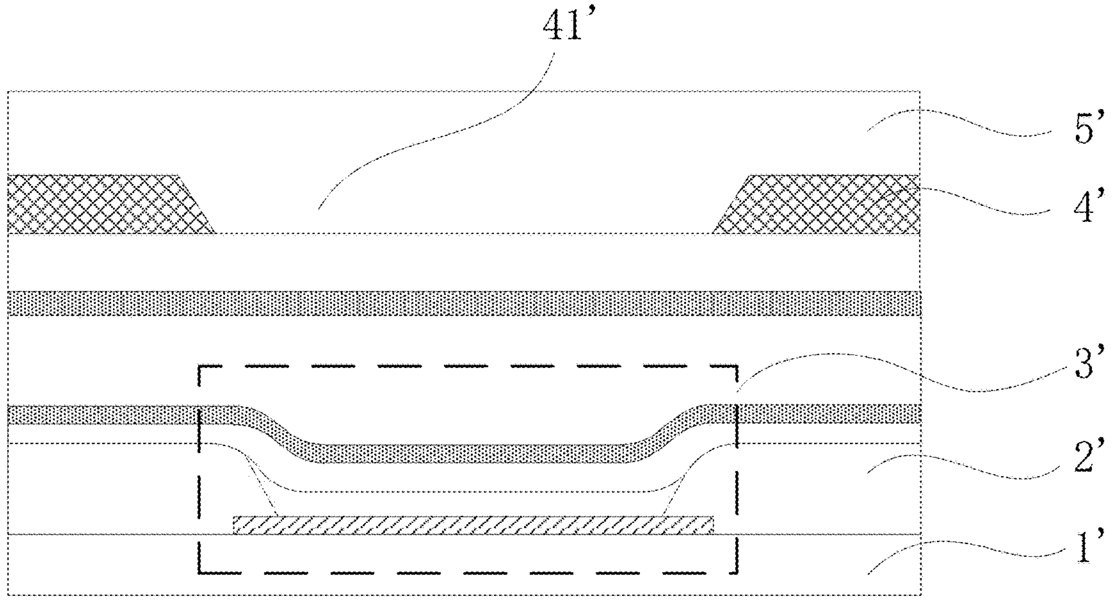
FIG. 2 is a schematic cross-sectional view of a section I-I as shown in FIG. 1.

FIG. 1 is a partial top view of a display panel 000 in the related art. FIG. 2 is a schematic sectional view of a section I-I as shown in FIG. 1. As shown in FIG. 1 and FIG. 2, the display panel 000 includes a substrate 1' and a pixel definition layer 2' that are stacked. The pixel definition layer 2' is located on one side of the substrate 1'. The pixel definition layer 2' includes a plurality of pixel openings 21' arranged in an array. The array arrangement may be understood to mean that the pixel openings are arranged in a repeating manner according to a certain rule (minimum repeating unit), and is not limited to the form of a matrix.

A plurality of light-emitting units 3' are corresponding to the pixel openings 21'. The light-emitting units 3' is located in the pixel opening 21'. The light-emitting units 3' may be light-emitting units that each can emit light of a different color. For example, the light-emitting units 3' may include a red light-emitting unit that can emit red light, a green light-emitting unit that can emit green light, and a blue light-emitting unit that can emit blue light. For example, as shown in FIG. 2, in the embodiments of the present application, organic light-emitting diodes (OLEDs) may be selected for the fabrication of the above-mentioned light-emitting units 3'. Alternatively, the light-emitting units 3' may be provided as micro light-emitting diodes (Micro-LEDs for short) or quantum light-emitting diodes (QLEDs for short).

The display panel 000 further includes a first dimming layer 4'. The first dimming layer 4' is located on a side of the pixel definition layer 2' that is away from the substrate 1'. The first dimming layer 4' includes a plurality of dimming openings 41'. As shown in FIG. 1, the dimming openings 41' are in one-to-one correspondence with the pixel openings 21'. There is a preset interval S between the dimming opening 41' and the edge of the pixel opening 21'.

Figure 3:
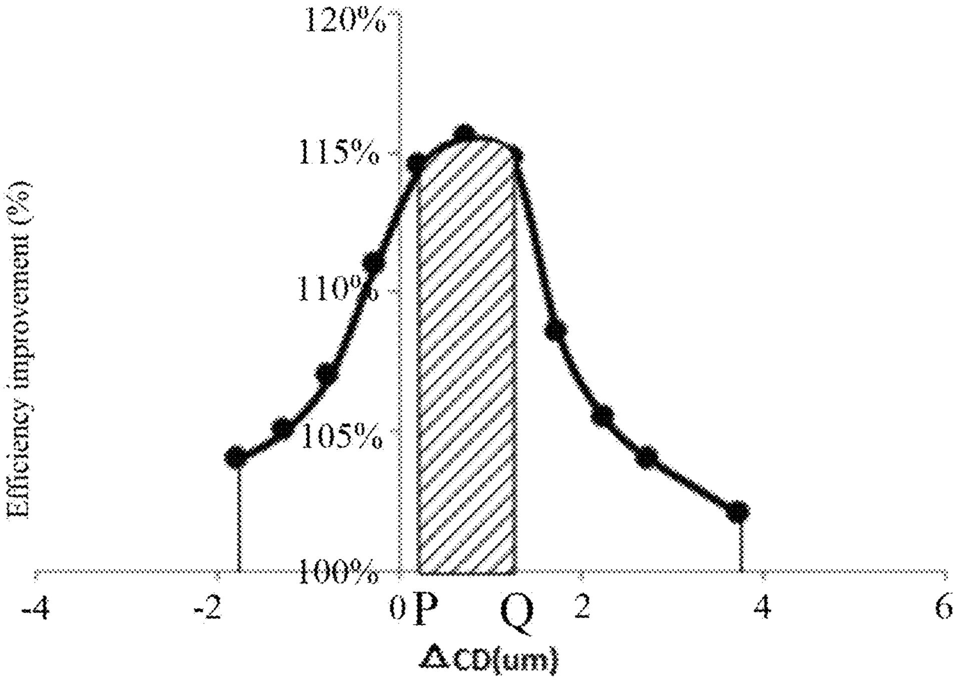
FIG. 3 is a diagram showing a relationship of a preset distance S (ΔCD) between the dimming opening and the edge of the pixel opening with improvement in light emitting efficiency.

FIG. 3 is a diagram showing a relationship of a preset distance S (ACD) between the dimming opening 41' and the edge of the pixel opening 21' with improvement in light emitting efficiency. It can be seen that in the FIG. 3, when the value of S is in the interval [P, Q], the improvement of light emitting efficiency is the most ideal. Once the value of S exceeding this interval, the light emitting efficiency will decrease greatly.

The display panel 000 further includes a second dimming layer 5'. The second dimming layer 5' is located on a surface of a side of the first dimming layer 4' that is away from the substrate 1'. The second dimming layer 5' completely fills the dimming opening 41'. A refractive index $n_1$ of the first dimming layer 4' is less than a refractive index $n_2$ of the second dimming layer 5', so that a light ray emitted at a large angle by the light-emitting unit 3', after being refracted or reflected by the first dimming layer 4', continues to exit through the second dimming layer 5' at a small angle, thereby improving the light efficiency of the front surface of the display panel.

Figure 4:
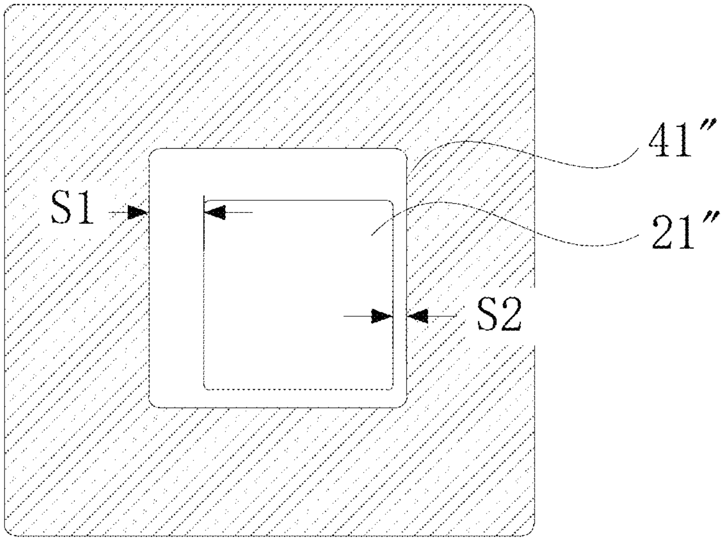
FIG. 4 is a partial schematic view of a display panel with alignment deviation in the related art.

However, during the manufacturing process of the display panel, the alignment deviation of the mask plate and the randomness during the process may lead to dislocation between the light opening 41" and the pixel opening 21" in the finally formed display panel, as shown in FIG. 4. FIG. 4 is a partial schematic diagram of a display panel having alignment deviation in the related art. The preset interval S is changed, and at least two non-preset values S1 and S2 are generated. As shown in FIG. 3, the preset interval S between the dimming opening 41' and the edge of the pixel opening 21' is generally set to the value corresponding to the highest light emitting efficiency, and the occurrence of the non-preset values may cause the improvement in light efficiency to be away from the expectation or the light efficiency may even decrease.

Figure 5:
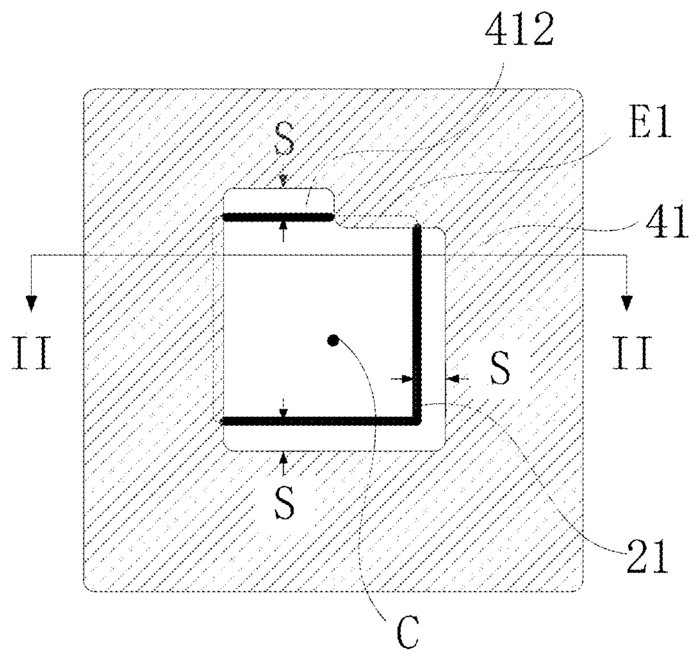
FIG. 5 is a partial top view of a display panel according to an embodiment of the present application.
Figure 6:
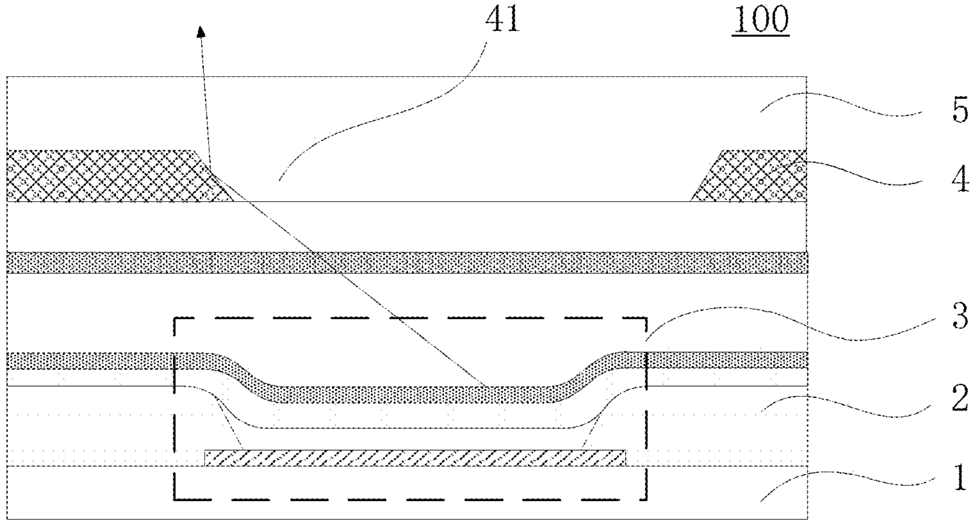
FIG. 6 is a schematic cross-sectional view of a section II-II in FIG. 5.

FIG. 5 is a partial top view of a display panel according to an embodiment of the present application. FIG. 6 is a schematic sectional view of a section II-II in FIG. 5. In order to ensure that the light emitting efficiency of the dimming layer is not affected by errors in the manufacturing process, as shown in FIG. 5 and FIG. 6, the present application provides a display panel 100 including a substrate 1 and a pixel definition layer 2 that are stacked. The pixel definition layer 2 is located on one side of the substrate 1. The pixel definition layer 2 includes a plurality of pixel openings 21 arranged in an array. The array arrangement may be understood to mean that the pixel openings are arranged in a repeating manner according to a certain rule (minimum repeating unit), and is not limited to the form of a matrix. A plurality of light-emitting units 3 are corresponding to the pixel openings 21. The light-emitting unit 3 is located in the pixel opening 21. In an optional implementation, the light-emitting units 3 are in one-to-one correspondence with the pixel openings 21, and one light-emitting unit 3 is located in one pixel opening 21. In another optional implementation, the light-emitting units 3 are not in one-to-one correspondence with the pixel openings 21, and multiple of the light-emitting units 3 are located in one pixel opening 21. The light-emitting units 3 may be light-emitting units that can emit light of a different color.

The display panel 100 further includes a first dimming layer 4 located on a side of the pixel definition layer 2 that is away from the substrate 1. The first dimming layer 4 includes a plurality of dimming openings 41. The dimming opening 41 is corresponding to the pixel opening 21. In an optional implementation, the dimming openings 41 are in one-to-one correspondence with the pixel opening 21. In another optional implementation, the dimming openings 41 are not in one-to-one correspondence with the pixel opening 21.

Figure 7:
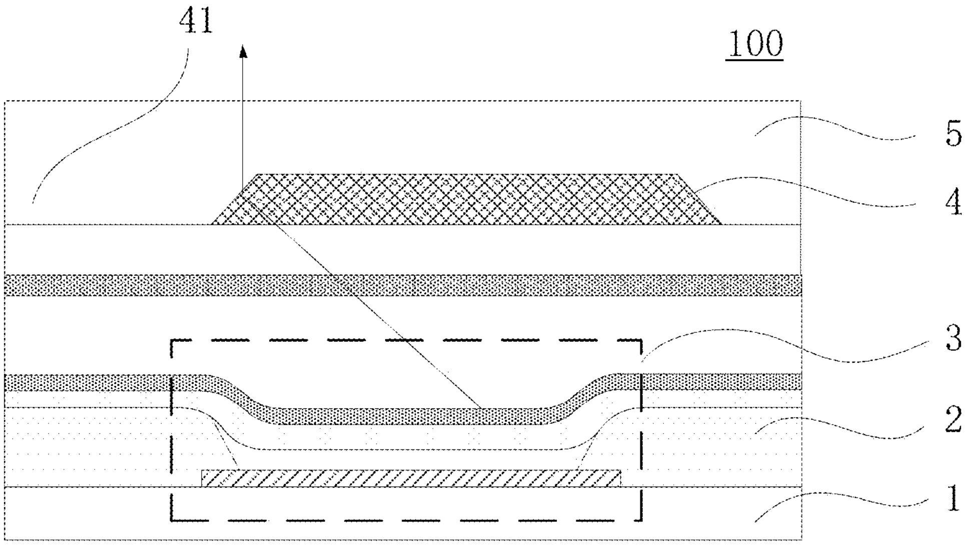
FIG. 7 is a schematic cross-sectional view of a display panel according to an embodiment of the present application.

Generally, the dimming opening 41 at least partly overlaps the light-emitting unit 3 in the light-emitting direction. In this case, the first dimming layer 4 is generally a film layer with a low-refractive index. When the first dimming layer 4 is a film layer with a high refractive index, the dimming opening 41 may also be located directly above the pixel defining layer 2, as shown in FIG. 7. FIG. 7 is a schematic cross-sectional view of a display panel according to an embodiment of the present application. It is to be understood that FIG. 6 and FIG. 7 are equivalent structures, and for the simplicity of the description, the following embodiments will be described based on only one of them. A refractive index of the film layer with a low refractive index may be in a range of 1.3-1.6, and a refractive index of the film layer with a high refractive index may be in a range of 1.6-1.8. A person skilled in the art can achieve different dimming effects of the first dimming layer 4 on the light-emitting unit 3 by selecting a film layer with a low refractive index film layer and a film layer with a high refractive index that have different refractive indices.

The display panel 100 further includes a second dimming layer 5. The second dimming layer 5 is located on a surface of a side of the first dimming layer 4 that is away from the substrate 1. The second dimming layer 5 completely fills the dimming opening 41. A refractive index $n_1$ of the first dimming layer 4 is less than a refractive index $n_2$ of the second dimming layer 5, so that a light ray emitted at a large angle by the light-emitting unit 3, after being refracted or reflected by the first dimming layer 4, continues to exit through the second dimming layer 5 at a small angle, thereby improving the light efficiency of the front surface of the display panel.

Figure 8:
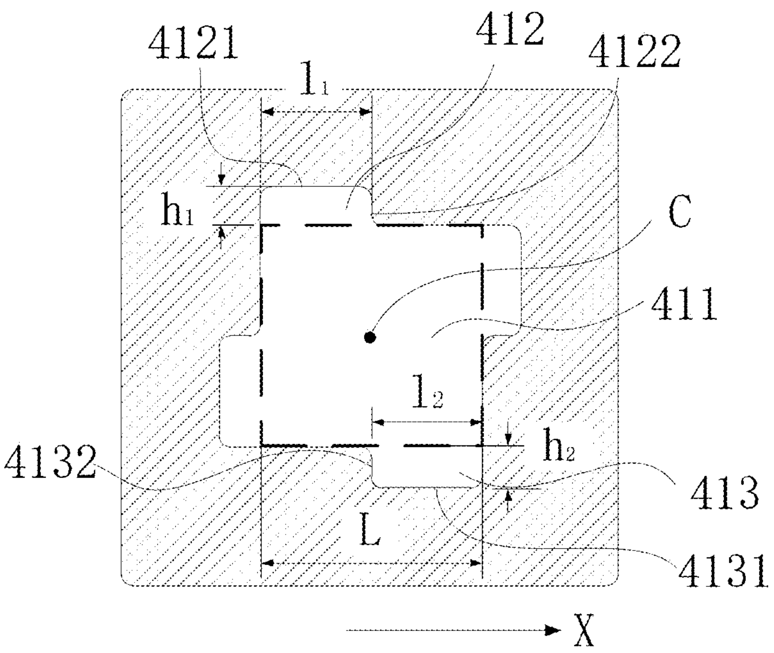
FIG. 8 is a top view of a first dimming layer according to an embodiment of the present application.

FIG. 8 is a top view of a first dimming layer according to an embodiment of the present application. As shown in FIG. 8, in an implementation of the present application, a projection of the dimming opening 41 on the substrate 1 includes a body portion 411 (illustrated by the dotted box) and at least one first protrusion 412 connected to the body portion 411.

As shown in FIG. 5, a projection of the pixel opening 21 on the substrate 1 includes a first side edge E1. In a plane of the projection, the first protrusion 412 is at least partially located on a side of the first side edge E1 that is away from a center C of the dimming opening 41. The center C of the dimming opening 41 may be the geometric center of the body portion 411.

By providing the body portion 411 and the at least one first protrusion 412 connected to the body portion 411 in the dimming opening 41 in the display panel, during the fabrication of the display panel, the alignment deviation between the mask plate and the substrate will be partially offset by the first protrusion 412. As shown in FIG. 5, even if the alignment deviation of the dimming opening 41 of the first dimming layer 4 occurs, due to the presence of the first protrusion 412, the improvement of light efficiency on at least some parts of the first side edge E1 (the thickened parts in FIG. 5) can be ensured. Therefore, the influence of process fluctuations on the light efficiency of the display panel can be reduced, the light extraction effect of the display panel can be improved, and good display effect of the display panel can be ensured.

In an implementation of the present application, the projections of the body portion 411 and its corresponding pixel opening on the substrate are similar patterns. The specific shape of the body portion is not limited herein. In FIG. 8, the main body 411 is rectangular and its corresponding pixel opening should also be rectangular, so as to obtain a better light extraction effect. If the pixel opening is of another shape, the corresponding body portion can be adjusted to be of a similar pattern corresponding to the pixel opening according to actual needs.

In an implementation of the present application, an area of the body portion 411 is greater than or equal to an area of the projection of the pixel opening on the substrate. In a case where the area of the body portion 411 is equal to the area of the projection of the pixel opening on the substrate, when the dimming opening is offset, the amount of redundancy in the deviation direction is reduced due to the presence of the first protrusion 412, so that the brightness difference in different orientations of the pixel when the offset occurs can be effectively contained. However, the actual situation is often not so ideal, in order to ensure a enough coverage by the dimming opening as possible, the area of the body portion 411 is generally set to be slightly larger than the area of the projection of the pixel opening on the substrate.

In an implementation of the present application, as shown in FIG. 8, a length $l_1$ of the first protrusion 412 in a first direction X, which is an extension direction of the first side edge E1, is less than a length L of the body portion 411 in the first direction X. In order to ensure good compensation effect provided by the first protrusion 412, the length $l_1$ and the length L may be set as $l_1 \geq L/2$.

In an implementation of the present application, as shown in FIG. 8, in the plane of the projection, the first protrusion 412 includes a first edge 4121 parallel to the first side edge E1. A minimum distance $h_1$ between the first edge 4121 and the body portion 411 satisfies $0 \leq h_1 < 1.5$ μm. In consideration of an actual process error range, and for a balanced compensation effect provided by the first protrusion 412, the minimum distance $h_1$ between the first edge 4121 and the body portion 411 may satisfy 0.5 μm$<h_1<$1.5 μm. If $h_1$ is too small, the first protrusion 412 may not provide enough compensation effect. If $h_1$ is too large, the presence of the first protrusion 412 may instead cause the light emitting efficiency of the pixel to deteriorate.

In an implementation of the present application, as shown in FIG. 8, in the plane of the projection, the first protrusion 412 includes a second edge 4122 perpendicular to the first side edge E1. In the actual fabrication, in consideration of the process fluctuation, if the angle between the and the first side edge E1 vary within 90°±5°, the second edge 4122 can be considered to be perpendicular or approximately perpendicular to the first side edge E1.

Figure 9:
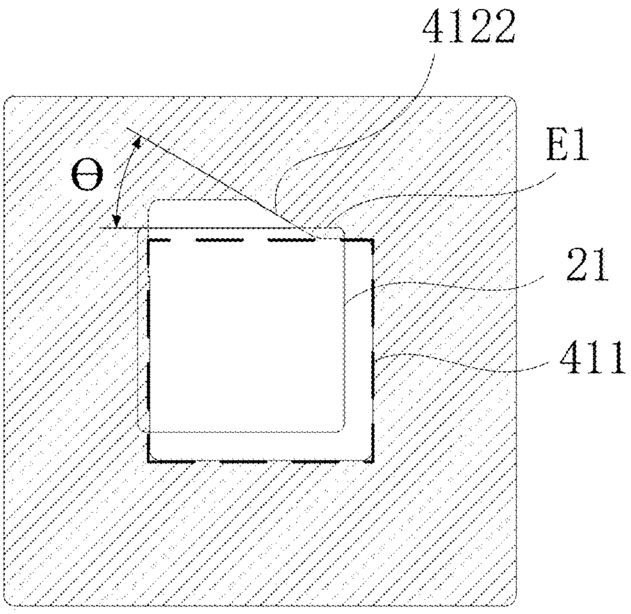
FIG. 9 is a partial top view of a display panel according to an embodiment of the present application.

However, the second edge 4122 of the first protrusion 412 may not be exactly perpendicular to the first side edge E1, or approximately perpendicular to the first side edge E1, due to the limitations of prior fabrication processes. In an implementation of the present application, as shown in FIG. 9, which is a partial top view of a display panel according to an embodiment of the present application. In the plane of the projection, the first protrusion 412 includes a second edge 4122 intersecting the first side edge E1, where at least one of the second edges 4122 has an included angle θ with the first side edge E1 of less than 90°. As shown in FIG. 9, since the included angle θ between at least one of the second edges 4122 and the first side edge E1 is less than 90°, the first protrusion 412 has a gradual adjustment effect, which is beneficial to improve the brightness uniformity of each azimuth angle.

Figure 10:
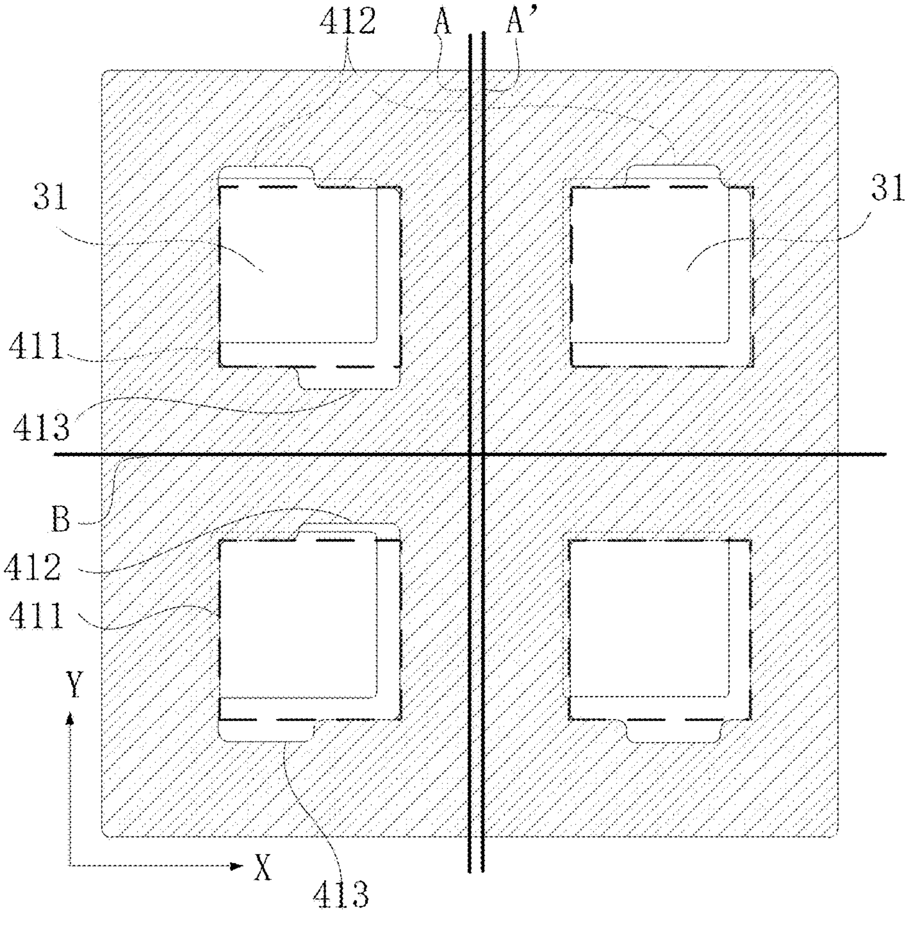
FIG. 10 is a partial top view of a display panel according to an embodiment of the present application.

In an implementation of the present application, as shown in FIG. 10, a partial top view of a display panel according to an embodiment of the present application is illustrated. The light-emitting units 3 include a plurality of first light-emitting units 31 arranged in an array that emit light of a same color. In the first direction X, adjacent two of the first light-emitting units 31 are symmetric with respect to a first symmetry axis A. Due to the dislocation of the dimming openings 41, the body portions 411 of the dimming openings 41 corresponding to the adjacent two of the first light-emitting units 31 are dislocated, and the body portions 411 are asymmetric with respect to the first symmetry axis A. At this time, the positions of the first protrusions 412 relative to the body portions 411 in the adjacent two of the first light-emitting units 31 are different.

Further, in the first direction X, the body portions 411 corresponding to the adjacent two of the first light-emitting units 31 are symmetrical with respect to a second symmetry axis A'. The first protrusions 412 corresponding to the adjacent two of the first light-emitting units 31 are also symmetrical with respect to the second symmetry axis A' (the corresponding implementation is not shown in the figures).

Since the deviation directions generated by the dimming openings 41 on the whole display panel 100 are the same, when the first protrusions 412 are at a same position, the positions where the light efficiency is improved (the positions of the first protrusions 412 relative to the corresponding pixel openings 21) are different, resulting in different intensities of exit light of a single pixel. With regard to an RGB panel, the shapes and sizes of sub-pixels of different colors are often different, and therefore the same offset amount may result in that the brightness difference of light-emitting units of different colors is more obvious, thereby bringing about a display color offset. Therefore, since the positions of the first protrusions 412 relative to the body portions 411 in the adjacent two of the first light-emitting units 31 are different, the brightness self-adaptation of light-emitting units of the same color can be achieved in the case where the deviation direction is not controllable, thereby reducing the brightness difference between light-emitting units of different colors, balancing the overall compensation effect of the display panel, and avoiding the color offset brought about by the randomness of the deviation direction.

Figure 11:
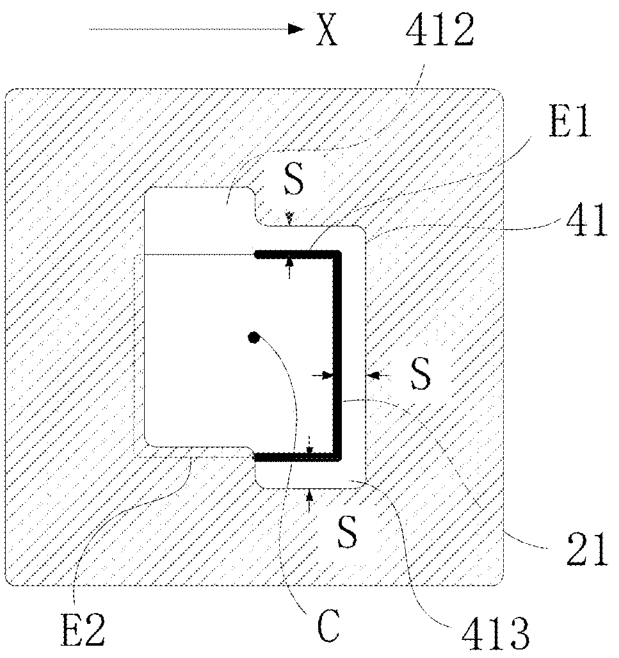
FIG. 11 is a partial top view of a display panel according to an embodiment of the present application.

In an implementation of the present application, as shown in FIG. 11, a partial top view of a display panel according to an embodiment of the present application is shown. The projection of the pixel opening 21 on the substrate includes a second side edge E2 extending along a first direction X. As shown by the pixel opening 21 in FIG. 11, the second side edge E2 may be parallel to the first side edge E1 or extend in substantially the same direction. In consideration of the process fluctuations, if the angle between the second side edge E2 and the first side edge E1 is within ±5°, they can be regarded as being parallel or extending in substantially the same direction. The projection of the dimming opening 41 on the substrate further includes at least one second protrusion 413. In the plane of the projection, the second protrusion 413 is located on a side of the second side edge E2 that is away from the center C of the dimming opening 41. The center C of the dimming opening 41 may be the geometric center of the body portion 411.

In the process of preparing the display panel, the factors causing alignment deviation between a mask plate and a substrate are complicated. The deviation direction of the alignment deviation may be different under different conditions. If only one side edge is provided with the protrusion, when the deviation direction is exactly opposite to the expected direction, the protrusion cannot effectively improve the improvement of light efficiency. Therefore, the inventors consider providing a second protrusion 413 on the opposite side to the first protrusion, so as to adapt to more deviation directions. The improvement in light efficiency on at least some parts of the second side edge E2 (the thickened parts) can be ensured due to the second protrusion 413, so that the influence of process fluctuation on the light efficiency of the display panel can be reduced, the light extraction effect of the display panel can be improved, and the good display effect of the display panel can be ensured.

In an implementation of the present application, as shown in FIG. 8, a length $l_2$ of the second protrusion 413 in a first direction X, which is an extension direction of the first side edge E1 and the second side edge E2, is less than a length L of the body portion 411 in the first direction X. In order to ensure the good compensation effect provided by the second protrusion 413, the length $l_2$ and the length L may be set as $l_2 \geq L/2$.

In an implementation of the present application, as shown in FIG. 8, the second protrusion 413 includes a third edge 4131 parallel to the second side edge E2 in the plane of the projection. A minimum distance h2 between the third edge 4131 and the body portion 411 satisfies $0 < h_2 \leq 1.5$ μm. In consideration of an actual process error range, and for a balanced compensation effect provided by the second protrusion 413, the minimum distance $h_2$ between the third edge 4131 and the body portion 411 may satisfy 0.5 μm$< h_2 \leq 1.5$ μm. If $h_2$ is too small, the second protrusion 413 may not provide enough compensation effect. If $h_2$ is too large, the presence of the second protrusion 413 may instead cause the light emitting efficiency of the pixel to deteriorate Similary to the arrangement of the first protrusion 412, in the plane of the projection, the second protrusion 413 includes a fourth edge 4132 perpendicular to the second side edge E2. In the actual fabrication, in consideration of the process fluctuation, if the angle between the fourth edge 4132 and the second side edge E2 vary within 90°±5°, the fourth edge 4132 can be considered to be perpendicular or approximately perpendicular to the second side edge E2.

The fourth edge 4132 of the second protrusion 413 may not be exactly perpendicular to the second side edge E2, or approximately perpendicular to the second side edge E2, due to the limitations of existing manufacturing processes. In an implementation of the present application, the second protrusion 413 includes a fourth edge 4132 intersecting the second side edge E2 in the plane of the projection. At least one of the fourth edges 4132 makes an angle of less than 90° with the second side edge E2.

In an implementation of the present application, as shown in FIG. 8, the second protrusion 413 and the first protrusion 412 are centrally symmetric with respect to the center C of the main body 411. With the centrosymmetric design, it is possible to avoid that the first protrusion 412 and the second protrusion 413 are on the same side to affect the light emitting efficiency when the alignment deviation perpendicular to the first direction X is generated between the mask plate and the substrate.

In an implementation of the present application, as shown in FIG. 10, a partial top view of a display panel according to an embodiment of the present application is illustrated. The light-emitting unit 3 includes a plurality of first light-emitting units 31 arranged in an array. The color of the exit light of the first light-emitting units 31 is the same. In a second direction Y, the body portions 411 corresponding to adjacent two of the first light-emitting units 31 are symmetric with respect to a third symmetry axis B. The first protrusion 412 corresponding to one of the adjacent two of the first light-emitting units 31 and the second protrusion 413 corresponding to the other of the adjacent two of the first light-emitting units 31 are symmetric. The second direction Y is perpendicular to the first direction X.

Since the deviation directions generated by the dimming openings 41 on the whole display panel 100 are the same, when the first protrusions 412 and the second protrusions 413 are at same positions, the positions where the light efficiency is improved (the positions of the first protrusions 412 and the second protrusions 413 relative to the corresponding pixel openings 21) are different, resulting in different intensities of exit light of a single pixel. With regard to an RGB panel, the shapes and sizes of sub-pixels of different colors are often different, and therefore the same offset amount may result in that the brightness difference of light-emitting units of different colors is more obvious, thereby bringing about a display color offset. Therefore, since the positions of the first protrusions 412 relative to the body portions 411 in the adjacent two of the first light-emitting units 31 are different (where the first protrusion 412 corresponding to one of the adjacent two of the first light-emitting units 31 and the second protrusion 413 corresponding to the other of the adjacent two of the first light-emitting units 31 are symmetric with respect to the third symmetry axis B), the brightness self-adaptation of light-emitting units of the same color can be achieved in the case where the deviation direction is not controllable, thereby reducing the brightness difference between light-emitting units of different colors, balancing the overall compensation effect of the display panel, and avoiding the color offset brought about by the randomness of the deviation direction.

Figure 12:
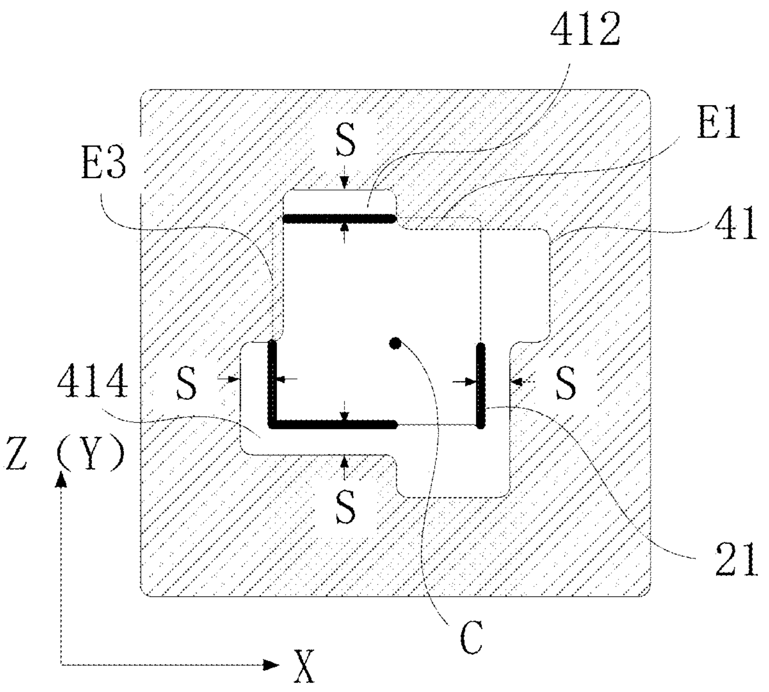
FIG. 12 is a partial top view of a display panel according to an embodiment of the present application.

In an implementation of the present application, as shown in FIG. 12, a partial top view of a display panel according to an embodiment of the present application is illustrated. The projection of the pixel opening 21 on the substrate includes a third side edge E3 extending along a third direction Z intersecting the first direction X. As shown in FIG. 12, when the pixel opening 21 is rectangular, the third direction Z is the same as the second direction Y. The third direction Z may also be changed adaptively when the pixel openings 21 are hexagonal or in other shapes.

The projection of the dimming opening 41 on the substrate further includes at least one third protrusion 414. In the plane of the projection, the third protrusion 414 is located at least partly on a side of the third side edge E3 that is away from the center C of the dimming opening 41.

In the process of preparing the display panel, the factors causing alignment deviation between a mask plate and a substrate are complicated. The deviation direction of the alignment deviation may be different under different conditions. If only one side edge is provided with the protrusion, when the deviation direction is exactly opposite to the expected direction, the protrusion cannot effectively improve the light efficiency. Therefore, the inventors consider providing the third protrusion 414 on the opposite side to the first protrusion, so as to adapt to more deviation directions. The improvement in light efficiency on at least some parts of the third side edge E3 (the thickened parts) can be ensured due to the third protrusion 414, so that the influence of process fluctuation on the light efficiency of the display panel can be reduced, the light extraction effect of the display panel can be improved, and the good display effect of the display panel can be ensured.

Similarly, as shown in FIG. 12, the other sides of the pixel openings 21 can also be provided with projections. No matter in which direction of the alignment deviation between the final mask plate and the substrate is, at least a part of the sides can always be guaranteed to have a part (a thickened part) with improved light efficiency, so that the solution has a better process tolerance rate.

Figure 13:
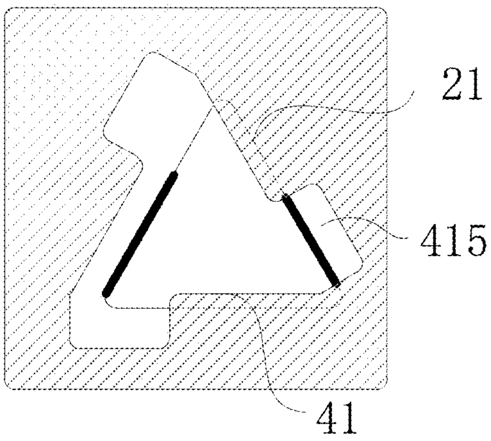
FIG. 13 is a partial top view of a display panel according to an embodiment of the present application.

In an implementation of the present application, as shown in FIG. 13, a partial top view of a display panel according to an embodiment of the present application is illustrated. The projection of the pixel opening 21 on the substrate includes n side edges. The projection of the dimming opening 41 on the substrate includes n side edges. If n is an odd number, each side of the dimming opening 41 is provided with a protrusion 415 in the plane of the projection. If n is an even number, at least one of the two adjacent sides of the dimming opening 41 is provided with a protrusion 415 in the plane of the projection. The projection 415 in this embodiment may have any of the features of the first protrusion 412, the second protrusion 413 and/or the third projection 414 in the previous embodiments, which will not be repeated.

Figure 14:
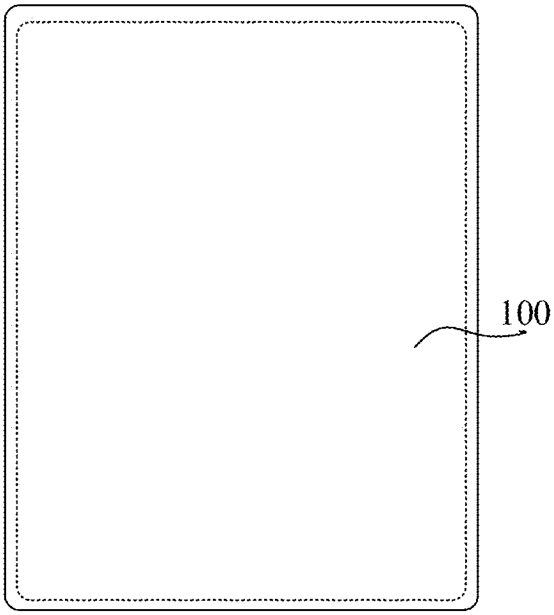
FIG. 14 is a schematic view of a display apparatus according to an embodiment of the present application.

Embodiments of the present application further provide a display apparatus. FIG. 14 is a schematic view of a display apparatus according to an embodiment of the present application. As shown, the display apparatus includes the display panel 100 according to any of the embodiments of the present application. The structure of the display panel 100 has been described in the above-described embodiments of the display panel, and will not be repeated. The display apparatus in the embodiments of the present application may be any device having a display function such as a mobile phone, a tablet computer, a notebook computer, an electronic paper book, a television, a smart wearable product, etc.

While the present application has been described connection with what is presently considered to be the most practical and preferred embodiments, it is to be understood that the application is not limited to the disclosed embodiments, but, on the contrary, is intended to cover various modifications and equivalent arrangements included within the spirit and scope of the appended claims.

Finally, it should be noted that, the above-mentioned embodiments are merely illustrative of the technical solution of the present application, and do not limit same; although the present application has been described in detail with reference to the foregoing embodiments, those skilled in the art will appreciate that: the technical solutions disclosed in the above-mentioned embodiments can still be modified or some or all of the technical features can be replaced by equivalents; such modifications and substitutions do not depart from the spirit and scope of the embodiments of the present application.

What is claimed is:

1. A display panel comprising:

a substrate;

a pixel definition layer located on a side of the substrate and comprising a plurality of pixel openings arranged in an array, a projection of at least one of the plurality of pixel openings on the substrate comprising a first side edge;

a plurality of light-emitting units, each of the plurality of light-emitting units being corresponding to one of the plurality of pixel openings and located in the corresponding one of the plurality of pixel openings;

a first dimming layer located on a side of the pixel definition layer away from the substrate, the first dimming layer comprising a plurality of dimming openings, each of the plurality of dimming openings being corresponding to one of the plurality of pixel openings;

a second dimming layer located on a surface of a side of the first dimming layer away from the substrate, a refractive index of the second dimming layer being greater than a refractive index of the first dimming layer;

a projection of at least one of the plurality of dimming openings on the substrate comprising a body portion and at least one first protrusion connected to the body portion, and in a plane of the projection of the at least one of the plurality of dimming openings on the substrate, the at least one first protrusion being at least partially located on a side of the first side edge of a projection of one of the plurality of pixel openings corresponding to the at least one of the plurality of dimming openings on the substrate, the side of the first side edge being away from a center of the at least one of the plurality of dimming openings;

wherein the body portion and the projection of the one of the plurality of pixel openings on the substrate are of the same shape, and a total area of the body portion is greater than or equal to a total area of the projection of the one of the plurality of pixel openings on the substrate; and an extension direction of the first side edge is a first direction, a length $l_1$ of the at least one first protrusion along the first direction is smaller than a length L of the body portion along the first direction, and $l_1 \geq L/2$.

2. The display panel according to claim 1, wherein in the plane of the projection of the at least one of the plurality of dimming openings on the substrate, the at least one first protrusion comprises a first edge parallel to the first side edge of the projection of the one of the plurality of pixel openings on the substrate, and a minimum distance $h_1$ between the first edge and the body portion satisfies $0 < h_1 \leq 1.5$ μm.

3. The display panel according to claim 1, wherein in the plane of the projection of the at least one of the plurality of dimming openings on the substrate, the at least one first protrusion comprises a second edge perpendicular to the first side edge of the projection of the one of the plurality of pixel openings on the substrate.

4. The display panel according to claim 1, wherein in the plane of the projection of the at least one of the plurality of dimming openings on the substrate, the at least one first protrusion comprises a second edge intersecting the first side edge of the projection of the one of the plurality of pixel openings on the substrate, wherein at least one second edge of the second edges of the first protrusions of the dimming openings makes an angle of less than 90° with the first side edge of the projection of the one of the plurality of pixel openings on the substrate.

5. The display panel according to claim 1, wherein the plurality of light-emitting units comprise a plurality of first light-emitting units arranged in an array;

in the first direction, for adjacent two of the plurality of first light-emitting units, a position of the at least one first protrusion relative to the body portion in one of the adjacent two of the plurality of first light-emitting units is different from a position of the at least one first protrusion relative to the body portion in the other one of the adjacent two of the plurality of first light-emitting units.

6. The display panel according to claim 1, wherein the plurality of light-emitting units comprise a plurality of first light-emitting units arranged in an array;

in the first direction, for adjacent two of the plurality of first light-emitting units, the body portion corresponding to one of the adjacent two of the plurality of first light-emitting units and the body portion corresponding to the other one of the adjacent two of the plurality of first light-emitting units are symmetrical with respect to a second symmetry axis, and the at least one first protrusion corresponding to one of the adjacent two of the plurality of first light-emitting units and the at least one first protrusion corresponding to the other one of the adjacent two of the plurality of first light-emitting units are also symmetrical with respect to the second symmetry axis.

7. The display panel according to claim 1, wherein the projection of the at least one of the plurality of pixel openings on the substrate comprises a second side edge extending along the first direction;

the projection of the at least one of the plurality of dimming openings on the substrate further comprises at least one second protrusion, and in the plane of the projection of the at least one of the plurality of dimming openings on the substrate, the at least one second protrusion is located on a side of the second side edge of the projection of the one of the plurality of pixel openings corresponding to the at least one of the plurality of dimming openings on the substrate, the side of the second side edge being away from the center of the at least one of the plurality of dimming openings.

8. The display panel according to claim 7, wherein in the first direction, a length $l_2$ of the at least one second protrusion is smaller than a length L of the body portion.

9. The display panel according to claim 8, wherein $l_2 \geq L/2$.

10. The display panel according to claim 8, wherein in the plane of the projection of the at least one of the plurality of dimming openings on the substrate, the at least one second protrusion comprises a third edge parallel to the second side edge, and a minimum distance $h_2$ between the third edge and the body portion satisfies $0 < h_2 \leq 1.5$ μm.

11. The display panel according to claim 8, wherein the at least one second protrusion and the at least one first protrusion are symmetrically arranged with respect to a center of the body portion.

12. The display panel according to claim 8, wherein the plurality of light-emitting units comprise a plurality of first light-emitting units arranged in an array;

in a second direction, for adjacent two of the plurality of first light-emitting units, the body portion corresponding to one of the adjacent two of the plurality of first light-emitting units and the body portion corresponding to the other one of the adjacent two of the plurality of first light-emitting units are symmetrical with respect to a third symmetry axis, wherein the at least one first protrusion corresponding to one of the adjacent two of the plurality of first light-emitting units and the at least one second protrusion corresponding to the other one of the adjacent two of the plurality of first light-emitting units are symmetrical with respect to the third symmetry axis;

the second direction is perpendicular to the first direction.

13. The display panel according to claim 1, wherein the projection of the at least one of the plurality of pixel openings on the substrate comprises a third side edge extending along a third direction intersecting the first direction;

the projection of the at least one of the plurality of dimming openings on the substrate further comprises at least one third protrusion, and in the plane of the projection of the at least one of the plurality of dimming openings on the substrate, the at least one third protrusion is at least partially located on a side of the third side edge of the projection of the one of the plurality of pixel openings corresponding to the at least one of the plurality of dimming openings on the substrate, the side of the third side edge being away from the center of the at least one of the plurality of dimming openings.

14. The display panel according to claim 1, wherein the projection of each of the plurality of pixel openings on the substrate comprises n side edges, the projection of each of the plurality of dimming openings on the substrate comprises n side edges, n is an odd number, and in the plane of the projection of each of the plurality of dimming openings on the substrate, each of the n side edges of the dimming opening is provided with the at least one first protrusion.

15. The display panel according to claim 1, wherein the projection of each of the plurality of pixel openings on the substrate comprises n side edges, the projection of each of the plurality of dimming openings on the substrate comprises n side edges, n is an even number, and in the plane of the projection of each of the plurality of dimming openings on the substrate, at least one of two adjacent side edges of the n side edges of the dimming opening is provided with the first at least one protrusion.

16. A display apparatus comprising a display panel, wherein the display panel comprises:

a substrate;

a pixel definition layer located on a side of the substrate and comprising a plurality of pixel openings arranged in an array, a projection of at least one of the plurality of pixel openings on the substrate comprising a first side edge;

a plurality of light-emitting units, each of the plurality of light-emitting units being corresponding to one of the plurality of pixel openings and located in the corresponding one of the plurality of pixel openings;

a first dimming layer located on a side of the pixel definition layer away from the substrate, the first dimming layer comprising a plurality of dimming openings, each of the plurality of dimming openings being corresponding to one of the plurality of pixel openings;

a second dimming layer located on a surface of a side of the first dimming layer away from the substrate, a refractive index of the second dimming layer being greater than a refractive index of the first dimming layer;

a projection of at least one of the plurality of dimming openings on the substrate comprising a body portion and at least one first protrusion connected to the body portion, and in a plane of the projection of the at least one of the plurality of dimming openings on the substrate, the at least one first protrusion being at least partially located on a side of the first side edge of a projection of one of the plurality of pixel openings corresponding to the at least one of the plurality of dimming openings on the substrate, the side of the first side edge being away from a center of the at least one of the plurality of dimming openings;

wherein the body portion and the projection of the one of the plurality of pixel openings on the substrate are of the same shape, and a total area of the body portion is greater than or equal to a total area of the projection of the one of the plurality of pixel openings on the substrate; and an extension direction of the first side edge is a first direction, a length $l_1$ of the at least one first protrusion along the first direction is smaller than a length L of the body portion along the first direction, and $l_1 \geq L/2$.

* * * * *